(12) United States Patent
Aoki et al.

(10) Patent No.: US 9,565,786 B2
(45) Date of Patent: Feb. 7, 2017

(54) SHEET-LIKE HEAT PIPE, AND ELECTRONIC DEVICE PROVIDED WITH SAME

(71) Applicant: FURUKAWA ELECTRIC CO., LTD., Tokyo (JP)

(72) Inventors: Hirofumi Aoki, Tokyo (JP); Masami Ikeda, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/467,928

(22) Filed: Aug. 25, 2014

(65) Prior Publication Data
US 2014/0360701 A1    Dec. 11, 2014

Related U.S. Application Data

(63) Continuation of application No. PCT/JP2013/053474, filed on Feb. 14, 2013.

(30) Foreign Application Priority Data

Feb. 24, 2012   (JP) .................................. 2012-038136

(51) Int. Cl.
*F28F 7/00*        (2006.01)
*H05K 7/20*        (2006.01)
(Continued)

(52) U.S. Cl.
CPC ........... *H05K 7/20336* (2013.01); *F28D 15/02* (2013.01); *F28D 15/0233* (2013.01);
(Continued)

(58) Field of Classification Search
CPC .. H05K 7/20336; F28D 15/02; F28D 15/0233; F28D 15/04; F28D 9/0087; F28D 15/046; F28D 15/0275; H01L 23/427; F28F 3/12; F28F 3/14
(Continued)

(56) References Cited

U.S. PATENT DOCUMENTS 5,560,423 A     10/1996  Larson et al.
7,019,976 B1 *   3/2006  Ahmad et al. ................ 361/704
(Continued)

FOREIGN PATENT DOCUMENTS

JP   09-159381 A   6/1997
JP   11-237193 A   8/1999
(Continued)

OTHER PUBLICATIONS

Combined Taiwanese Office Action and Search Report issued Dec. 15, 2014 in Patent Application No. 102105829 (with English language translation and English translation of categories of cited documents).
(Continued)

*Primary Examiner* — Marc Norman
*Assistant Examiner* — Jon T Schermerhorn
(74) *Attorney, Agent, or Firm* — Oblon, McClelland, Maier & Neustadt, L.L.P.

(57) ABSTRACT

A sheet-like heat pipe for a heat-generating element, which is intended to make an electronic device more compact, more lightweight, and thinner, while also reducing costs, is provided. A sheet-like heat pipe (10) of the present invention includes a container (17) in which the peripheries of the sheet-like members (11, 12) disposed facing each other are bonded to form a cavity inside, and a working liquid which is enclosed in a cavity (15) of the container (17). At least one of the sheet-like members (11, 12) disposed facing each
(Continued)

other is formed with protruding pieces (12A, 12B) which project outwards from the bonded part with the other sheet-like member and have a spring structure which causes the container (17) to elastically abut a heat-generating element (5) of an electronic device.

15 Claims, 7 Drawing Sheets

(51) Int. Cl.
  *H01L 23/427* (2006.01)
  *F28D 15/02* (2006.01)
  *F28D 15/04* (2006.01)
(52) U.S. Cl.
  CPC ............ *F28D 15/04* (2013.01); *H01L 23/427* (2013.01); *H01L 2924/0002* (2013.01)
(58) Field of Classification Search
  USPC ............................................ 165/46; 361/707
  See application file for complete search history.

(56) References Cited

U.S. PATENT DOCUMENTS

| 8,069,907 | B2 | 12/2011 | Bryant et al. |
| 2008/0141872 | A1* | 6/2008 | Jeng ................................ 100/35 |
| 2009/0071632 | A1 | 3/2009 | Bryant et al. |
| 2011/0232876 | A1* | 9/2011 | Chang et al. ............ 165/104.26 |

FOREIGN PATENT DOCUMENTS

| JP | 2000-065490 A | 3/2000 |
| JP | 2003-322483 A | 11/2003 |
| JP | 2004-012011 A | 1/2004 |
| JP | 2004-028442 A | 1/2004 |
| JP | 2005-136117 A | 5/2005 |
| JP | 2009-024996 A | 2/2009 |

OTHER PUBLICATIONS

International Search Report mailed Apr. 16, 2013 for PCT/JP2013/053474, filed Feb. 14, 2013.

* cited by examiner

FIG. 5A
FIG. 5C
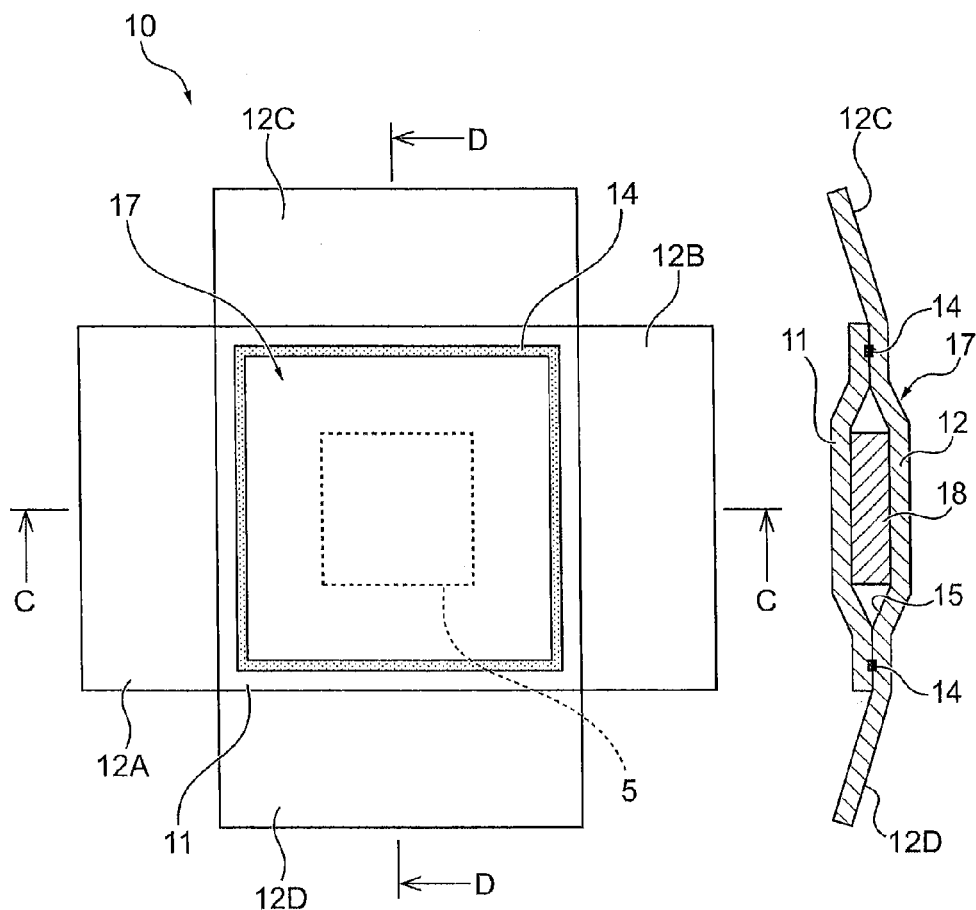
FIG. 5B
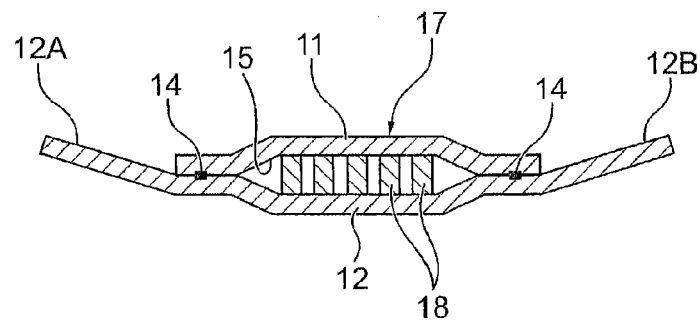

SHEET-LIKE HEAT PIPE, AND ELECTRONIC DEVICE PROVIDED WITH SAME

TECHNICAL FIELD

The present invention relates to a sheet-like heat pipe configured to cool heat-generating elements, such as CPUs, GPUs, antennas, batteries, etc., which are used in electronic devices including notebook PCs, tablet type information terminals, smartphones, etc. The present invention also relates to an electronic device provided with such a sheet-like heat pipe.

BACKGROUND ART

Recently, the above mentioned electronic devices have increasingly been made more compact, more lightweight, and thinner, as well as achieving more advanced performance. Accordingly, various heat-generating elements installed therein dissipate a larger amount of heat. To make the electronic device itself more compact, more lightweight, and thinner, a similar function is also required as a cooling device. In general, such electronic devices are cooled by a built-in heat pipe having a superior apparent thermal conductivity against metals, such as copper, aluminum, etc. The heat pipe itself, however, also has to be more compact, more lightweight, and thinner, as the electronic devices become more compact, more lightweight, and, and thinner.

Various shapes of heat pipes are known as cooling devices. For example, Patent Literature 1 discloses a structure in which a heat pipe having a circular cross-section is fixed by metal fittings on a metal plate, and the shape of a heat receiving portion is modified as a plane which is brought into contact with the metal plate. Patent Literature 2, for example, discloses a heat pipe (container) in which many cavities are formed, and a wick and a working liquid are enclosed therein. Screw-fastening holes are formed at portions of the heat pipe, through which springs or screws are fitted to fix the heat pipe on a substrate, while the heat pipe is pressed against a heat-generating body placed on the substrate. Patent Literature 3, for example, discloses a structure in which thin foil-like sheets made by different types of thermal refining are bonded together to provide a flexible container in which a wick and a working liquid are enclosed. Such a structure is provided as a flexible heat pipe structure (sheet-like heat pipe) which allows smooth thermal connections, even if there is a height gap between a heat-generating element and a heat sink.

CITATION LIST

Patent Literatures

Patent Literature 1: JP 9-159381 A
Patent Literature 2: JP 2003-322483 A
Patent Literature 3: JP 2004-12011 A

SUMMARY OF INVENTION

Technical Problem

As disclosed in the above mentioned Patent Literature 1, when the heat pipe is used in a heat-generating element of a conventional electronic device, the heat pipe is fixed to a heat-receiving metal plate by soldering or the like, and the heat-receiving metal plate is then fixed to the heat-generating element using springs, screws, etc., in a pressurized state, which leads to an increase in the number of components, prevents cost reduction, and causes weight increase. Since the electronic device also becomes thicker due to the thickness of fixed members, the application to the electronic devices such as the notebook PCs, tablet type information terminals, smartphones, etc., where more compact, more lightweight, and thinner devices are strongly required, is prohibited. Similarly, in the structure disclosed in the above mentioned Patent Literature 2, since the screw-fastening holes are formed at portions of the heat pipe, through which the springs or screws are fitted to fix the heat pipe on the base plate, the application to the electronic devices, where more compact, more lightweight, and thinner devices are strongly required, is prohibited. Further, as holes are provided, air-tightness is hardly guaranteed and processing is difficult.

In the above mentioned Patent Literature 3, a structure to fit the flexible heat pipe structure to the heat-generating element is not disclosed, but if the metal fittings such as screws or springs are used, the problems similar to those disclosed in the fitting structure of Patent Literatures 1 and 2 may occur. In this case, since the heat pipe has a flexible sheet structure, it might be possible to use adhesive thermal conductive tapes to fix a normal graphite sheet to the heat-generating element. However, such an adhesive thermal conductive sheet usually has a low thermal conductivity, and thermal resistance between the heat-generating element and a thermal conductive device (heat pipe) would increase, which is harmful in lowering the temperature of the heat-generating element. Since such a heat pipe structure is heavier than a graphite sheet, the heat pipe might be detached during use of the electronic device when fixed by the adhering force of the heat conductive tape alone.

The present invention has been achieved in view of the above problems, and an object of the present invention is to provide a sheet-like heat pipe for a heat-generating element, which is intended to make an electronic device more compact, more lightweight, and thinner, while reducing costs. Another object of the present invention is to provide a more compact, more lightweight, and thinner electronic device capable of effectively dissipating heat from a heat-generating element.

Solution to Problem

To achieve the above object, a sheet-like heat pipe according to the present invention includes a container in which peripheries of sheet-like members disposed facing each other are bonded to form a cavity inside, and a working liquid which is enclosed in the cavity of the container, wherein at least one of the sheet-like members disposed facing each other is formed with a protruding piece which project outwards from the bonded part with the other sheet-like member and have a spring structure which causes the container to elastically abut a heat-generating element of an electronic device.

The sheet-like heat pipe having the above mentioned structure is placed to cool various heat-generating elements (e.g., CPU and GPU) which are arranged in the electronic device. The container, in which the working liquid is stored, abuts such heat-generating elements of the electronic device. In this case, the protruding pieces formed around the container have a spring structure, and these protruding pieces are latched inside the electronic device to cause the container part elastically to abut the heat-generating elements. In the sheet-like heat pipe placed in this manner, the working liquid enclosed in the container evaporates in the container by heat from the heat-generating elements, moves towards an end area which is not in contact with the heat-generating elements to dissipate heat, and returns to the liquid phase. The working liquid having returned to the liquid phase refluxes towards the heat-generating element again to cool the heat-generating element.

In the sheet-like heat pipe having the above mentioned structure, the sheet-like members disposed facing each other are formed with the protruding pieces to which the spring structure is provided in advance, and the spring force of the protruding pieces is used to cause the heat-generating elements to abut the container. This eliminates the need to provide metal fittings (e.g., screws or springs) to fix the sheet-like heat pipe at a predetermined position and reduces the number of components to reduce costs, while making the electronic device more compact, more lightweight, and thinner.

In the above structure, when it is assumed that the maximum stress acting on the protruding pieces having the spring structure of the sheet-like members disposed facing each other is $\sigma max$, the sheet-like members are preferably made by a material having bearing force larger than $\sigma max$.

In these sheet-like members, the protruding pieces can reliably be deformed elastically without being deformed plastically, within a predetermined range of load to be generated relative to the heat-generating elements. It is, therefore, possible to cause the container to abut the heat-generating element stably to maintain a cooling function.

In the above mentioned sheet-like heat pipe, it is preferable to set the protruding pieces to have at least 100 gf of load to be generated by the spring structure.

Such a sheet-like heat pipe can effectively cool the heat-generating element of a small, mobile type electronic device such as a smartphone.

In the above mentioned sheet-like heat pipe, the protruding pieces having the spring structure, which are formed in the sheet-like members disposed facing each other, can be formed in various manner depending on the target electronic devices. For example, the protruding pieces may be formed on the entire periphery of the container abutting the heat-generating element, or may be formed at several locations on the periphery of the container abutting the heat-generating element so as to generate load in different directions.

Also, the protruding pieces may be formed with positioning openings.

By forming such openings, the sheet-like heat pipe can be positioned and held there reliably when incorporated into the electronic device in such a manner that projections or the like, which are formed in advance on latching parts to latch the protruding pieces, are inserted into the openings. Accordingly, a stable cooling function can be provided. Since such openings are not formed in the container, airtightness of the container would not be damaged.

To bond the above mentioned sheet-like members disposed facing each other, various bonding methods, such as laser welding, seam welding, cold pressure welding, diffusion bonding, brazing, etc. can be used.

Preferably, at least a piece of wick structure configured to generate capillary force is stored in the container.

By storing such a wick structure, the working liquid, which has returned to the liquid phase after dissipating heat in the container, can easily reflux quickly to the side of the heat-generating elements by the capillary force of the wick structure, to thereby cool the heat-generating elements effectively.

The inside of the sheet-like members disposed facing each other to form the container may be subjected to surface treatment in advance to allow transportation of the working liquid by the capillary force.

As the container is formed by disposing the surface-treated sheet-like members to face each other, the working liquid can be transported easily and the sheet-like heat pipe having good cooling efficiency can be manufactured easily.

Further, the present invention provides the electronic device incorporating the sheet-like heat pipe formed as mentioned above. The electronic device includes latching parts provided to latch the protruding pieces of the sheet-like heat pipe, and applies spring force to the protruding pieces to cause the container to abut the heat-generating elements.

In such an electronic device, it is sufficient to provide the latching parts alone to latch the protruding pieces so as to allow the sheet-like heat pipe to elastically abut the heat-generating elements. It is unnecessary to incorporate springs or screws to assemble the sheet-like heat pipe. It is also unnecessary to get the springs or screws to penetrate through the container of the sheet-like heat pipe, and the airtightness of the container would not be damaged. Regarding assembling of the sheet-like heat pipe, as the elastic force of the protruding pieces can be used for latching, it is unnecessary to use adhesive thermal conductive tapes. As the thermal resistance does not increase during cooling in the thermal conductive action, the cooling efficiency would not be damaged.

Advantageous Effects of Invention

According to the present invention, a sheet-like heat pipe for a heat-generating element capable of making a more compact, more lightweight, and thinner electronic device, while reducing costs is provided. Also, the electronic device according to the present invention can effectively dissipate heat from the heat-generating element to make a more compact, more lightweight, and thinner electronic device.

BRIEF DESCRIPTION OF DRAWINGS

FIGS. 5(a) to 5(c) illustrate a second embodiment of the sheet-like heat pipe, in which 5(a) is a plan view, 5(b) is a cross-sectional view cut along line C-C of 5(a), and 5(c) is a cross-sectional view cut along line D-D of 5(a).

DESCRIPTION OF EMBODIMENTS

In the following, embodiments of a sheet-like heat pipe according to the present invention will be described in a specific manner by referring to the accompanying drawings.

Figure 1:
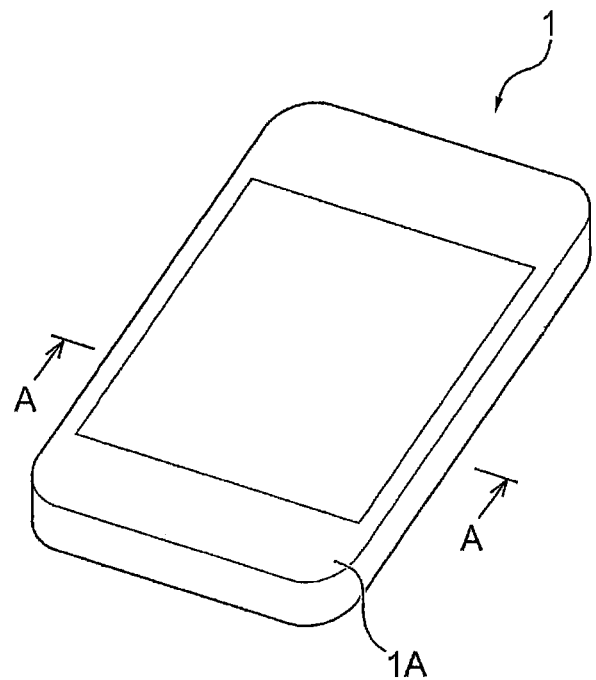
FIG. 1 is a perspective view illustrating an example of an electronic device according to the present invention.
Figure 2:
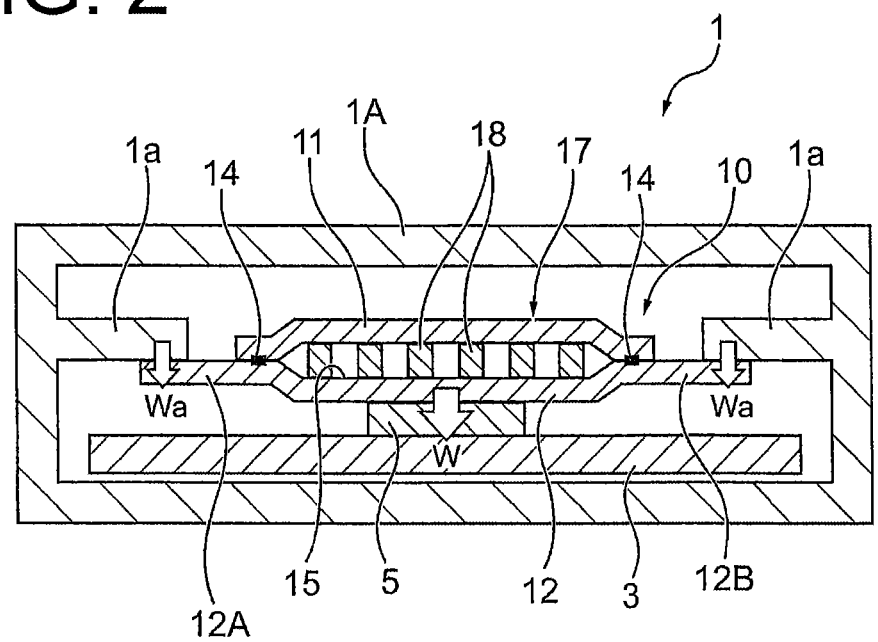
FIG. 2 is a cross-sectional view cut along line A-A of FIG. 1, illustrating a first embodiment of a sheet-like heat pipe.
Figure 3A:
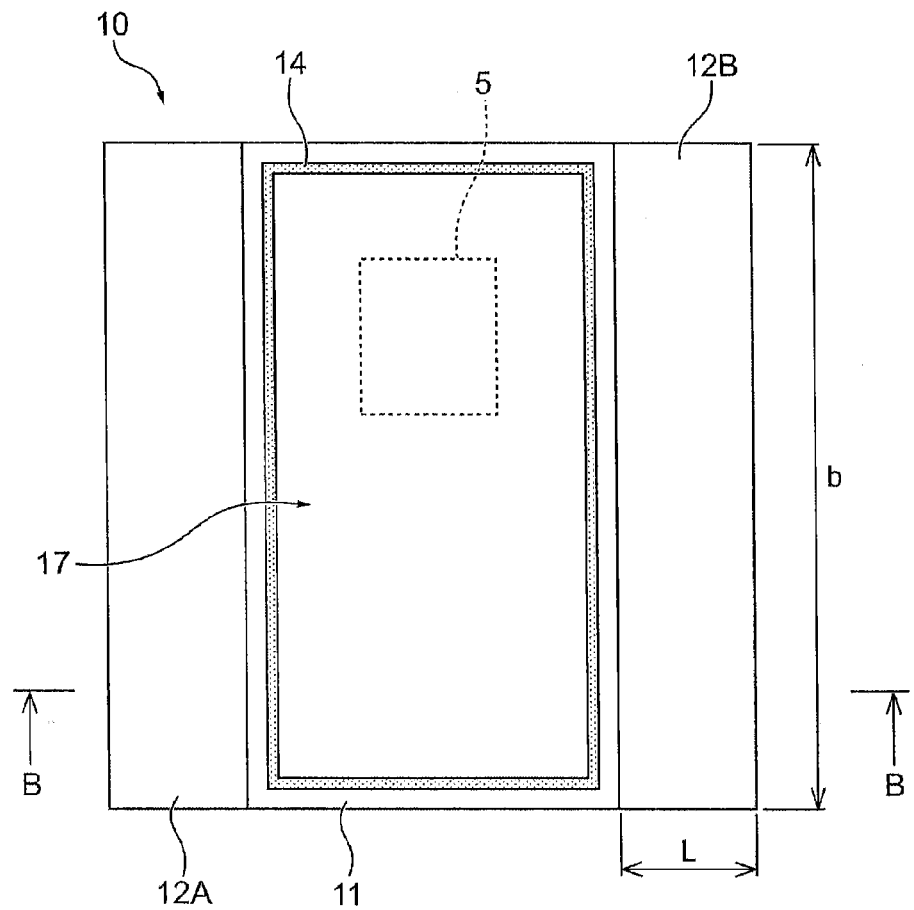
FIGS. 3(a) and 3(b) illustrate the sheet-like heat pipe of FIG. 2, in which 3(a) is a plan view and 3(b) is a cross-sectional view cut along line B-B of 3(a).
Figure 3B:
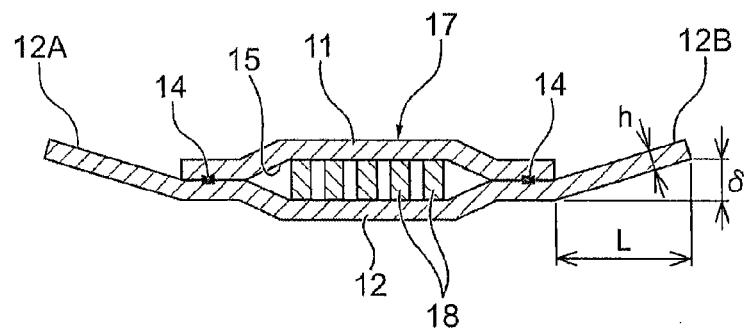
Figure 4:
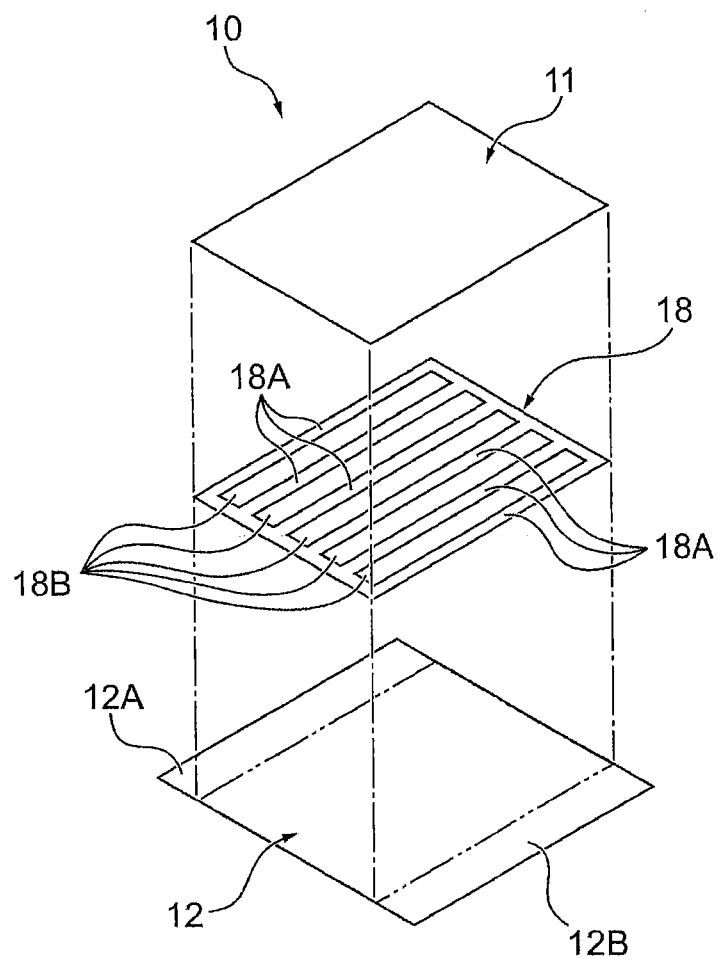
FIG. 4 is an exploded perspective view illustrating a structure of the sheet-like heat pipe.

FIGS. 1 to 4 illustrate a first embodiment of a sheet-like heat pipe, in which FIG. 1 is a perspective view of an electronic device incorporating the sheet-like heat pipe, FIG. 2 is a cross-sectional view cut along line A-A of FIG. 1, FIG. 3 (a) is a plan view of the sheet-like heat pipe, FIG. 3(b) is a cross-sectional view cut along ling B-B of FIG. 3(a), and FIG. 4 is an exploded perspective view illustrating a structure of the sheet-like heat pipe.

The structure of a sheet-like heat pipe 10 according to the present embodiment is suitable for dissipating heat generated by a heat-generating element 5 mounted on a substrate 3 (e.g., CPU or GPU mounted on a substrate) which is placed inside an electronic device 1 as illustrated in FIG. 1, such as a smartphone, in particular.

In this case, the sheet-like heat pipe 10 of the present embodiment includes a container 17 in which the peripheries of sheet-like members 11, 12 disposed facing each other are bonded to form a cavity 15 inside, at least a piece of wick structure 18 stored in the container 17 configured to generate capillary force, and a working liquid (not shown) which is enclosed in the cavity 15 of the container 17. For ease of understanding of the structure, cross-sections of the sheet-like heat pipe in FIGS. 2 and 3(b) have been deformed.

The sheet-like members 11, 12 are made of a material, such as copper in the present embodiment, which has a high thermal conductivity. Both members are cut into rectangles, with the upper and lower sheet-like members 11, 12 having the same width b, and the lower sheet-like material 12 projecting from both sides of the upper sheet-like member 11 by a length L. When the upper sheet-like member 11 and the lower sheet-like member 12 are overlapped and bonded at the overlapped parts (the bonded parts are indicated by a reference numeral 14), the lower sheet-like member 12 projects outwards (to both left and right sides in FIGS. 3(a) and 3(b)) from the bonded parts 14 with the upper sheet-like member 11, to thereby form protruding pieces 12A, 12B having a width b and a projecting length L. The "sheet-like members" configured to form the sheet-like heat pipe are of about 0.05 mm to 1 mm, and preferably of 0.1 mm to 0.5 mm, according to the use.

A container 17 having a closed periphery is formed inside the bonded part 14 of the sheet-like members 11, 12 to perform heat dissipating action, whose cavity 15 encloses at least a piece of wick structure 18 and a working liquid by keeping airtightness. The container 17 having such a structure is formed by overlapping the sheet-like members in such a manner that the wick structure 18 is placed where the cavity 15 is to be formed, the peripheries thereof are bonded, the working liquid is poured and enclosed therein, and air is remove by heating, vacuum drawing, or a combination of these means to seal by caulking or welding.

Types of the working liquid to be enclosed in the container 17 are not particularly limited, but examples include water, hydrochlorofluorocarbon such as HCFC-22, etc., hydrofluorocarbon such as HFCR134a, HFCR407C, HFCR410A, HFC32, etc., hydrofluoroolefin such as HFO1234yf, carbonic acid gas, ammonia, and propane. Among these, water, carbon acid gas, hydrofluoroolefin, etc. are preferable by considering performance and influence to the global environment. The working liquid is appropriately selected according to the material or quality of the material of the sheet-like members 11, 12.

The wick structure 18 stored in the cavity 15 has a sheet structure, for example, as illustrated in FIG. 4, including a reflux channel 18A, where capillary force is generated, and a vapor channel 18B. The wick structure 18 is formed integrally by a material having high thermal conductivity, and a metal material such as copper is used. The wick structure 18 of the present embodiment is formed by a known method of punching a sheet-like member, which is made of a mesh-shaped thin film, in a longitudinal direction at predetermined intervals. The resulting punched cavity becomes the vapor channel 18B, and the other part becomes the reflux channel 18A having capillary force. In FIGS. 2, 3(a), and 3(b), therefore, heat generated in a heat-generating element 5 of the electronic device is transmitted to the wick structure 18 via the lower sheet-like member 12. In the cavity 15 thereof, the working liquid is evaporated by the heat from the heat-generating element 5 and moved toward the end side through the vapor channel 18B. When returned to the liquid phase again after dissipating heat, the working liquid refluxes through the reflux channel 18A to the heat generating unit (heat receiving unit) again, to thereby achieving a heat sink function.

In forming the protruding pieces 12A, 12B, the sheet-like members 11, 12 are formed so as to provide the spring structure. That is, as illustrated in FIG. 2, the protruding pieces 12A, 12B are latched at latching parts 1a having been formed in advance in a housing 1A of the electronic device 1. Accordingly, the container 17 capable of performing the heat dissipating action can closely contact, by restoring force of the spring structure thereof, the heat-generating element 5 with a predetermined load (elastic force) W.

In this case, the load (elastic force) W is set according to the required specification or the like of the electronic device 1 in the range of 100 gf to 5 kgf, for example. In designing the size of a mobile device or the like of the present embodiment, a practical setting may be about 100 gf to 2 kgf (although the upper limit of the load is not particularly set, it is sufficient to set the load not more than 1 kgf to prevent applying a large load to the heat-generating element 5 and thickening the sheet-like heat pipe itself).

In particular, the protruding pieces 12A, 12B of the above mentioned size are formed in the lower sheet-like member 12 on both sides of the container. The top surface of the tip of each protruding piece 12A, 12B is abutted against and held at the latching part 1a of the housing 1A to generate elastic force as illustrated in FIG. 2. In this structure, each protruding piece 12A, 12B is made to bend upwards by δ as illustrated in FIG. 3 (b), to thereby generate a load $Wa=bh^3E\delta/4L^3$ for each spring structure. Thus, the load W=2Wa can be generated as the sheet-like heat pipe. That is, a desired load W can be generated in the container 17 by appropriately setting a vertical elastic coefficient E of the constituent material of the sheet-like member 12, a projecting length L of the protruding pieces 12A, 12B, a width b, a thickness h, and a bending amount δ of the sheet-like material 12.

The sheet-like heat pipe 10 may be fixed to the housing 1 by the spring force of the protruding pieces 12A, 12B by pressing them down by δ and abutting against the latching part 1a, as mentioned above. Alternatively, a fixing structure such as a flat-head screw may be used. Preferably, the heat receiving area (where heat is received from the heat-generating element 5) of the container 17 is formed to be in contact with the heat-generating element 5 by applying, for example, thermal conductive grease on a corresponding area (enclosed by a dotted line) of the sheet-like member 12.

When it is assumed that the maximum stress applied to the protruding pieces having the spring structure is σmax, it is preferable that the sheet-like member 12 is made of a material having bearing force (which represents stress commonly used in the field of material mechanics to generate constant plastic strain (0.2% strain), and is also referred to as 0.2% bearing force) larger than σmax. In particular, in the present embodiment where the rectangular protruding pieces 12A, 12B are formed on both sides of the container 17, it is preferable to use a material having a bearing force larger than 6 LW/bh², where W indicates load to be generated. That is, in the mounting method as illustrated in FIG. 2, each of the protruding piece 12A, 12B works as a cantilevered beam and receives the maximum load at the base end of each protruding piece. Accordingly, so long as the sheet-like member 12 is made of a material having the bearing force larger than 6 LW/bh² which is a fixed end stress generated at the base end, the protruding pieces 12A, 12B can continue to apply stable load to the heat-generating element 5 without being deformed plastically.

Needless to say, regarding the bearing force of the sheet-like member, the position and magnitude that the maximum σmax is applied may change according to the shapes of the protruding pieces, a position where the load is applied, how the load is applied, and what is required as a load. However, so long as the bearing force of the sheet-like member is larger than the maximum stress generated at the protruding pieces having the spring structure, it is possible to reliably maintain the elastic deformation and continue to generate stable elastic force. In the sheet-like heat pipe 10 having the above mentioned structure, when copper is used as a constituent material to apply a load of 100 gf to 2 kgf to the heat-generating element 5, each protruding piece 12A, 12B would have a projecting length L of about 2 mm to 10 mm, a width b of about 3 mm to 50 mm, and a thickness h of about 0.05 mm to 0.5 mm.

In the sheet-like heat pipe 10 having the above mentioned structure, the spring force of the protruding pieces 12A, 12B formed on both sides of the container 17 is used to cause the container to abut the heat-generating element 5. Accordingly, the need for providing metal fittings (e.g., screws or springs) to fix the sheet-like heat pipe at a predetermined position is eliminated, the less number of parts and processing steps are used to reduce costs, and the electronic device can be made more compact, more lightweight. Further, since it is not necessary to secure the thickness for the metal fittings inside the housing of the electronic device, as illustrated in FIG. 2, the electronic device can be made thinner. Since the screw mounting holes or the like are not formed in the container, the airtightness of the container can be guaranteed to maintain a stable heat dissipation function.

Since the sheet-like heat pipe 10 of the present embodiment is fixed by the abutting and holding structure using the elastic force of the protruding pieces 12A, 12B, there is no need to use adhesive thermal conductive tapes for fixing. Accordingly, increase of thermal resistance of the sheet-like members is prevented, and less damage may occur during the decrease of temperature of the heat-generating element 5.

In the electronic device incorporating the sheet-like heat pipe 10 having the above mentioned structure, it is sufficient to provide the latching part alone to elastically latch the protruding pieces 12A, 12B of the sheet-like heat pipe 10. Accordingly, there is no need to provide a structure or space to incorporate the screws or springs for the sheet-like heat pipe, nor use the adhesive thermal conductive tapes. The electronic device can then be made more compact, more lightweight, and thinner, while providing a stable cooling effect.

To bond the sheet-like members 11, 12 disposed facing each other, various bonding methods such as laser welding, seam welding, cold pressure welding, diffusion bonding, brazing, etc. can be used. In this case, the most suitable bonding method can be used according to the constituent material of the sheet-like members 11, 12. For example, as in the present embodiment, when a metal material such as copper having a high thermal conductivity is used as the sheet-like members, it would be preferable to use a welding method so as not to raise temperatures, such as laser welding, seam welding, or cold pressure welding. That is, when such a bonding method is used, the material property of the sheet-like members would not change by heat, and the stable spring force can be exerted on the protruding pieces.

Next, another embodiment of the sheet-like heat pipe will be described. In the embodiment described below, similar constituent elements to the embodiment described above will be indicated by the same reference signs and a detailed explanation thereof will not be repeated.

FIGS. 5(a) to 5(c) illustrate a second embodiment of the sheet-like heat pipe in which 5(a) is a plan view, 5(b) is a cross-sectional view cut along line C-C of 5(a), and 5(c) is a cross-sectional view cut along line D-D of 5(a).

In the present embodiment, a rectangular container 17 having a heat dissipation function is formed, and the protruding pieces 12A, 12B, 12C, and 12D are formed along the entire periphery thereof. Similar to the above described embodiment, the protruding pieces herein are formed by the lower sheet-like member 12, with each protruding piece bent to have a spring structure.

In such a structure, a uniform load can be exerted on the heat-generating element 5 so as to attain a more stable abutting condition. A more compact sheet-like heat pipe can be provided, as the load to the heat-generating element 5 is distributed at four locations.

Figure 6A:
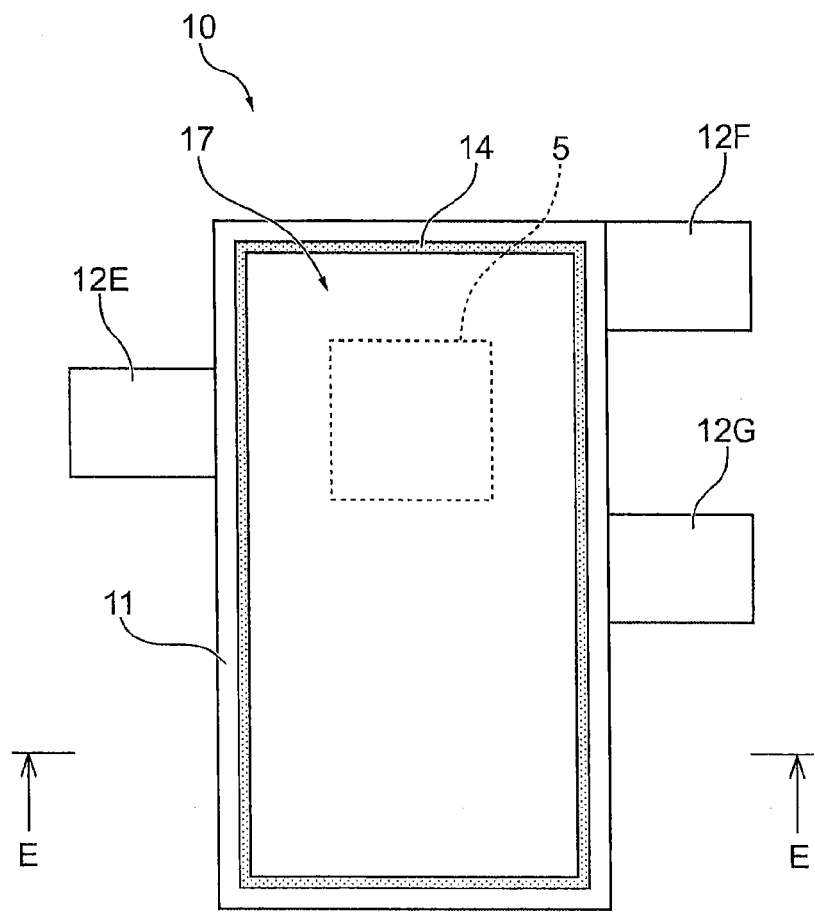
FIGS. 6(a) and 6(b) are cross-sectional views illustrating a third embodiment of the sheet-like heat pipe, in which 6(a) is a plan view and 6(b) is a cross-sectional view cut along line E-E of 6(a).
Figure 6B:
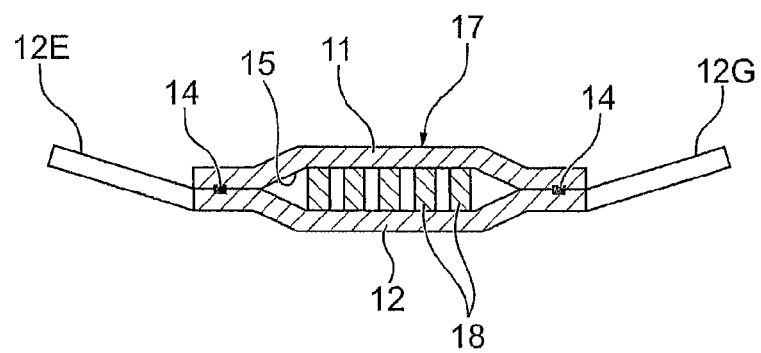

FIGS. 6(a) and 6(b) illustrate a third embodiment of the sheet-like heat pipe, in which 6(a) is a plane view and 6(b) is a cross-sectional view cut along line E-E of 6(a).

In this embodiment, a protruding piece 12E is formed on one side of the container 17, while a plurality of (two) protruding pieces 12F, 12G are formed on the other side.

Figure 7A:
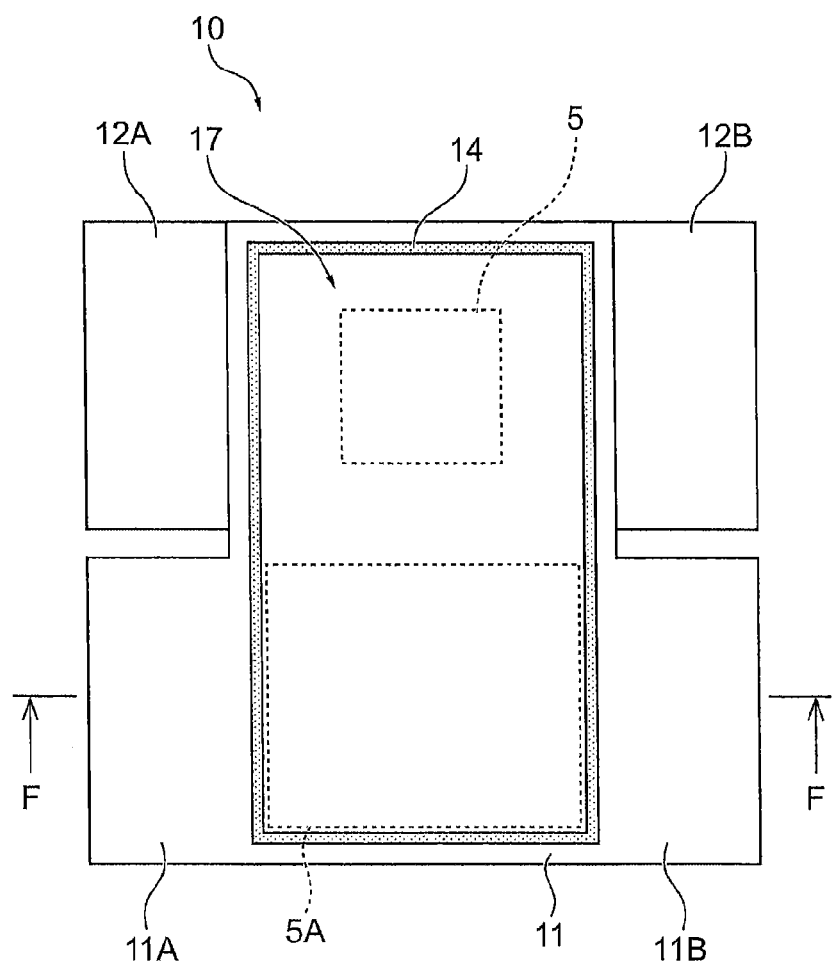
FIGS. 7(a) and 7(b) illustrate a fourth embodiment of the sheet-like heat pipe, in which 7(a) is a plan view and 7(b) is a cross-sectional view cut along line F-F of 7(a).
Figure 7B:
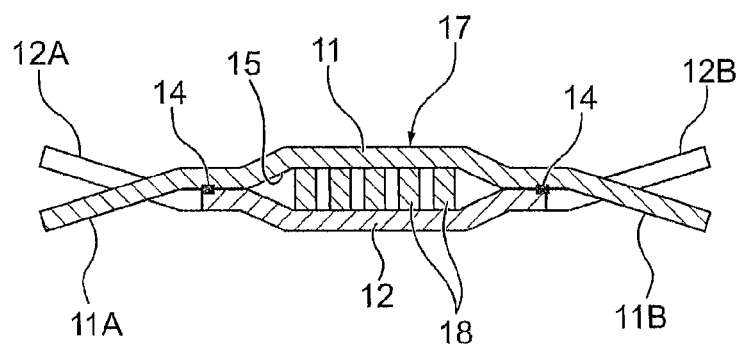

FIGS. 7(a) and 7(b) illustrate a fourth embodiment of the sheet-like heat pipe, in which 7(a) is a plan view and 7(b) is a cross-sectional view cut along line F-F of 7(a).

In this embodiment, the protruding pieces 12A, 12B similar to those in the first embodiment are formed in the lower sheet-like member 12 configured to form the container 17, while protruding pieces 11A, 11B projecting outwards from both sides of the container are formed in the upper sheet-like member 11. Thus, the abutting force is applied to the container 17 from different directions. Such a structure allows simultaneous cooling of the heat-generating elements 5, 5A which are disposed facing each other and vertically offset from each other by a single sheet-like heat pipe, to thereby save space and cost. Alternatively, one may be abutted to the heat-generating elements to receive heat by the sheet-like heat pipe, while the other may be abutted to the housing to dissipate heat.

As described above, the protruding pieces formed in the facing sheet-like members that form the container 17 can be suitably modified according to the structure of the electronic device, the arrangement of the heat-generating elements, etc.

Figure 8A:
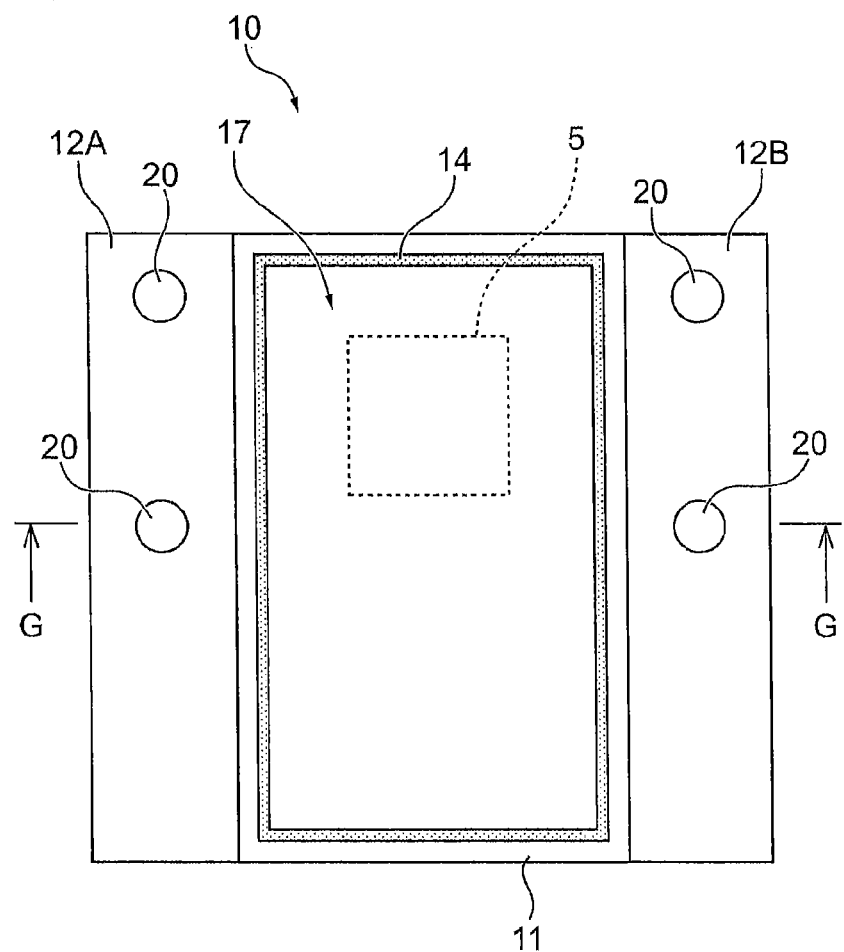
FIGS. 8(a) and 8(b) illustrate a fifth embodiment of the sheet-like heat pipe, in which 8(a) is a plan view and 8(b) is a cross-sectional view cut along line G-G of 8(a).
Figure 8B:
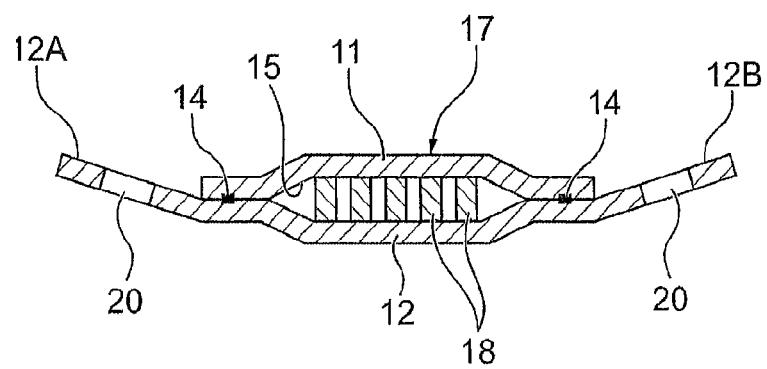

FIGS. 8(a) and 8(b) illustrate a fifth embodiment of the sheet-like heat pipe, in which 8(a) is a plan view and 8(b) is a cross-sectional view cut along line G-G of 8(a).

In this embodiment, a plurality of positioning openings 20 are formed in the protruding pieces 12A, 12B of the first embodiment mentioned above.

With such openings 20 being formed, when the sheet-like heat pipe 10 is incorporated in the electronic device, protrusions formed in the latching part 1a (see FIG. 2) for latching the protruding pieces are inserted in the openings 20 to reliably position and hold the sheet-like heat pipe at a predetermined position. Accordingly, a stable cooling function can be applied to the heat-generating element. Since openings 20 are not formed in the container 17, the airtightness of the container 17 is not damaged. The openings 20 illustrated in FIGS. 8(a) and 8(b) are applicable to other embodiments mentioned above.

The embodiments of the present invention have been described above, but the present invention is not limited to these embodiments and various modifications are possible. The sheet-like members configured to form the sheet-like heat pipe may be made, other than copper, by a material having good thermal conductivity, such as aluminum, an aluminum alloy, etc. The shape of the protruding pieces projecting from the periphery of the container (bonded part) of the sheet-like members is not limited to rectangles as indicated in the embodiments, and may be changed appropriately so long as the structure (spring structure) has restoring force when the container is pressed against the heat-generating elements with a predetermined load. The thickness may not be uniform in the projecting direction. As the cooling effect can be provided by the above mentioned working liquid, it may not be necessary to store the wick structure 18 inside the container 17. However, when the wick structure is stored, more than one piece of wicks may be overlapped to be stored. The structure thereof may not be limited to the embodiments described above and various modifications are possible. Alternatively, in the structures either having or not having the wick structure, the inside of the sheet-like members 11, 12 disposed facing each other that form the container 17 may be subjected to surface treatment (e.g., forming projections and recesses or many lines) so as to allow transportation of the working liquid by capillary force.

REFERENCE SIGNS LIST

1 ELECTRONIC DEVICE
1A HOUSING
1a LATCHING PART
5 HEAT-GENERATING ELEMENT
10 SHEET-LIKE HEAT PIPE
11, 12 SHEET-LIKE MEMBER
11A, 11B, 12A to 12G PROTRUDING PIECE
14 BONDED PART
15 CAVITY
17 CONTAINER
18 WICK STRUCTURE
20 OPENING

The invention claimed is:

1. A sheet-like heat pipe, comprising:
a container in which peripheries of sheet-like members disposed facing each other are bonded at a bonded part to form a cavity inside; and
a working liquid which is enclosed in the cavity of the container, wherein
at least one of the sheet-like members disposed facing each other is formed with protruding pieces which project outwards from the bonded part with the other sheet-like member and include a spring structure which causes the container to elastically abut a heat-generating element of an electronic device, so that the container directly contacts an entire surface of one side of the heat-generating element without the spring structure and the protruding pieces directly contacting the heat-generating element, the protruding pieces including the spring structure are formed at several locations so as to generate load in different directions on a periphery of the container which abuts the heat-generating element, and the at least one of the sheet-like members and the protruding pieces including the spring structure together form a single integral piece,
the protruding pieces project outwards from the container in a direction of extension of the container, and
the protruding pieces are abutted against and held at latching parts formed in the electronic device so that the container closely contacts, by a restoring force of the spring structure of the protruding pieces, the heat-generating element with a predetermined elastic force, and so that the container dissipates heat from the heat-generating element.

2. The sheet-like heat pipe according to claim 1, wherein when a maximum stress to be applied to a portion of the protruding pieces including the spring structure of the sheet-like members disposed facing each other is σmax, the sheet-like members are formed by a material including a bearing force greater than σmax.

3. The sheet-like heat pipe according to claim 2, wherein the protruding pieces are set to include at least a load of 100 gf generated by the spring structure.

4. The sheet-like heat pipe according to claim 1, wherein the protruding pieces including the spring structure are formed on an entire periphery of the container which abuts the heat-generating element.

5. The sheet-like heat pipe according to claim 1, wherein a positioning opening is formed in the protruding pieces.

6. The sheet-like heat pipe according to claim 1, wherein the sheet-like members disposed facing each other are bonded by either laser welding, seam welding, cold pressure welding, diffusion bonding, or brazing.

7. The sheet-like heat pipe according to claim 1, wherein at least a piece of wick structure which generates capillary force is provided in the container.

8. The sheet-like heat pipe according to claim 1, wherein an inside of the sheet-like members disposed facing each other to form the container is subjected to a surface treatment to allow transportation of the working liquid by a capillary force.

9. An electronic device, comprising:
the sheet-like heat pipe according to claim 1; and
the latching parts which latch the protruding pieces of the sheet-like heat pipe, wherein
the latching parts apply the restoring force to the spring structure of the protruding pieces to cause the container to abut the heat-generating element.

10. The electronic device according to claim 9, wherein the protruding pieces are bent, and a bent part of the protruding pieces is elastically deformed to cause the container to elastically abut the heat-generating element at the predetermined elastic force.

11. The sheet-like heat pipe according to claim 1, wherein the protruding pieces of one of the sheet-like members cross over the protruding pieces of the other sheet-like member in a cross-sectional view cut through both the one of the sheet-like members and the other sheet-like member.

12. The sheet-like heat pipe according to claim 1, wherein under the predetermined elastic force, the protruding pieces bend against the restoring force of the spring structure of the protruding pieces while the container does not substantially bend.

13. The sheet-like heat pipe according to claim 1, wherein only the container contacts the heat-generating element.

14. The sheet-like heat pipe according to claim 1, wherein the predetermined elastic force is in a range of 100 gf to 5 kgf.

15. A sheet-like heat pipe, comprising:
a container in which peripheries of sheet-like members disposed facing each other are bonded at a bonded part to form a cavity inside; and
a working liquid which is enclosed in the cavity of the container, wherein
at least one of the sheet-like members disposed facing each other is formed with protruding pieces which project outwards from the bonded part with the other sheet-like member and include a spring structure which causes the container to elastically abut a heat-generating element of an electronic device, so that the container directly contacts an entire surface of one side of the heat-generating element without the protruding pieces directly contacting the heat-generating element, the protruding pieces including the spring structure are formed at several locations so as to generate load in different directions on a periphery of the container which abuts the heat-generating element, and the at least one of the sheet-like members and the protruding pieces including the spring structure together form a single integral piece, and
the protruding pieces of one of the sheet-like members cross over the protruding pieces of the other sheet-like member in a cross-sectional view cut through both the one of the sheet-like members and the other sheet-like member.

* * * * *